United States Patent [19]
Ackley et al.

[11] Patent Number: 5,349,210
[45] Date of Patent: Sep. 20, 1994

[54] OPTICAL READING HEAD WITH ANGLED ARRAY

[75] Inventors: Donald E. Ackley, Lambertville, N.J.; Michael S. Lebby, Apache Junction; Gary F. Witting, Scottsdale, both of Ariz.

[73] Assignee: Motorola, Inc., Schaumburg, Ill.

[21] Appl. No.: 12,488

[22] Filed: Feb. 2, 1993

[51] Int. Cl.⁵ ............................................. H01L 33/00
[52] U.S. Cl. ...................................... 257/84; 257/85; 257/88; 257/95; 257/98; 372/48; 372/50; 235/472; 235/454
[58] Field of Search ...................... 257/84, 85, 88, 95, 257/98; 372/48, 50; 235/472, 454, 457, 473

[56] References Cited

U.S. PATENT DOCUMENTS

| | | | |
|---|---|---|---|
| 4,974,036 | 11/1990 | Kapon | 257/17 |
| 5,105,239 | 4/1992 | Uchino et al. | 257/98 X |

FOREIGN PATENT DOCUMENTS

| | | | |
|---|---|---|---|
| 0208527 | 1/1987 | European Pat. Off. | 257/85 |
| 2421590 | 11/1975 | Fed. Rep. of Germany | 257/95 |
| 61-204992 | 9/1986 | Japan | 257/85 |

*Primary Examiner*—William Mintel
*Attorney, Agent, or Firm*—Gary F. Witting; Eugene A. Parsons

[57] ABSTRACT

An article and method for manufacturing an optical reading head (400,500) including an optically transparent substrate (100) with a first surface (103) and a second surface (116), wherein the first surface (103) and the second surface (116) are joined at an angle. Depositing a plurality of layers having an upper portion (114), a middle portion (111, 112, 113), and a lower portion (101) that are optically active on the first and second surfaces (103, 116) of the optically transparent substrate (100). Forming light emitting devices (406, 407) in the plurality of layers on the second surface (116), thereby generating light emitting devices (406, 407) on the angle in the plurality of layers of the second surface (116). Positioning a detection device (402) in a normal plane to the first surface (103).

7 Claims, 5 Drawing Sheets

OPTICAL READING HEAD WITH ANGLED ARRAY

BACKGROUND OF THE INVENTION

This invention relates, in general, to optical devices and, more particularly, to optical reading heads and the fabrication of same.

At the present time, optical reading heads are used in a variety of image processing equipment, such as facsimile machines, optical scanners, and the like. Generally, these optical reading heads are used for converting documents or images into electronic signals that are then further processed or sent to remote locations.

Conventionally, optical reading heads are manufactured by assembling a large number individually manufactured components, such as micro-lenses, optical substrates, light producing devices, light detection devices, and the like to make an optical reading head. However, manufacturing optical reading heads using conventional methods are inefficient, expensive, as well as having a large process variation. Further, it should be pointed out that conventionally manufactured optical reading heads commonly require sophisticated micro-lenses that are expensive, thus further adding to the total cost of the optical reading head.

It can readily be seen that conventional methods for making optical reading heads have severe cost limitations. Also, it should be evident that use of conventional assembly or fabrication uses a multitude of steps which are not only complex and expensive, but also not effective. Therefore, a method for solving the aforementioned problems which provides a method for making an optical reading head that provides a reduction in the number of steps required, reduces cost, and simplifies the overall process required for making an optical reading head would be highly desirable.

SUMMARY OF THE INVENTION

Briefly stated, an article and method for manufacturing an optical reading head is provided. An optically transparent substrate with a first surface and a second surface is provided. The first surface and the second surface of the optically transparent substrate are joined with the first surface of the optically transparent substrate defining a normal plane and the second surface of the optically transparent substrate defining an angle at which the first surface and the second surface are joined. Depositing a plurality of layers having an upper portion, a middle portion, and lower portion that are optically active on the first and second surfaces of the optically transparent substrate. Forming light emitting devices in the plurality of layers on the second surface, thereby generating light emitting devices on an angle in the plurality of layers on the second surface. Positioning a detection device in a plane normal to the first surface.

DETAILED DESCRIPTION OF THE DRAWINGS

Figure 1:
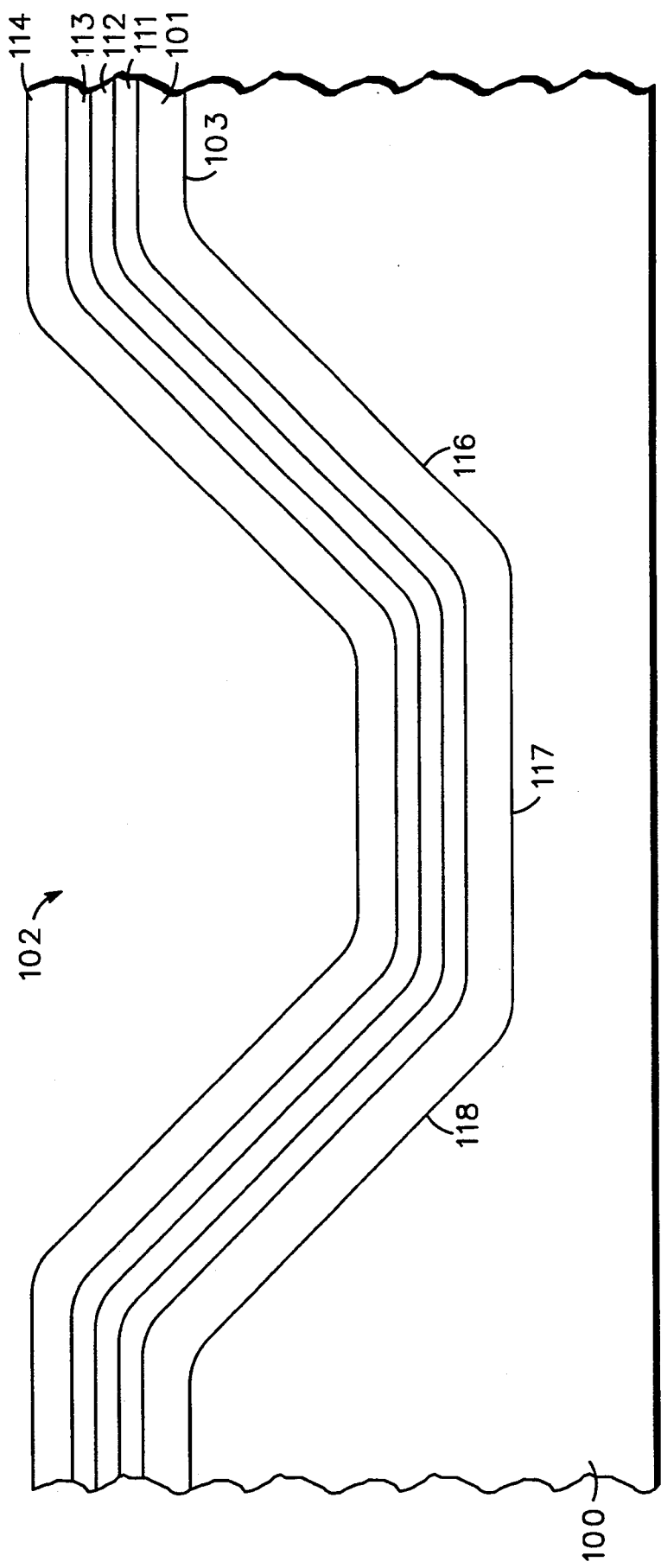
FIG. 1 is an enlarged cross-sectional view of a substrate having a plurality of layers deposited thereon.
Figure 4:
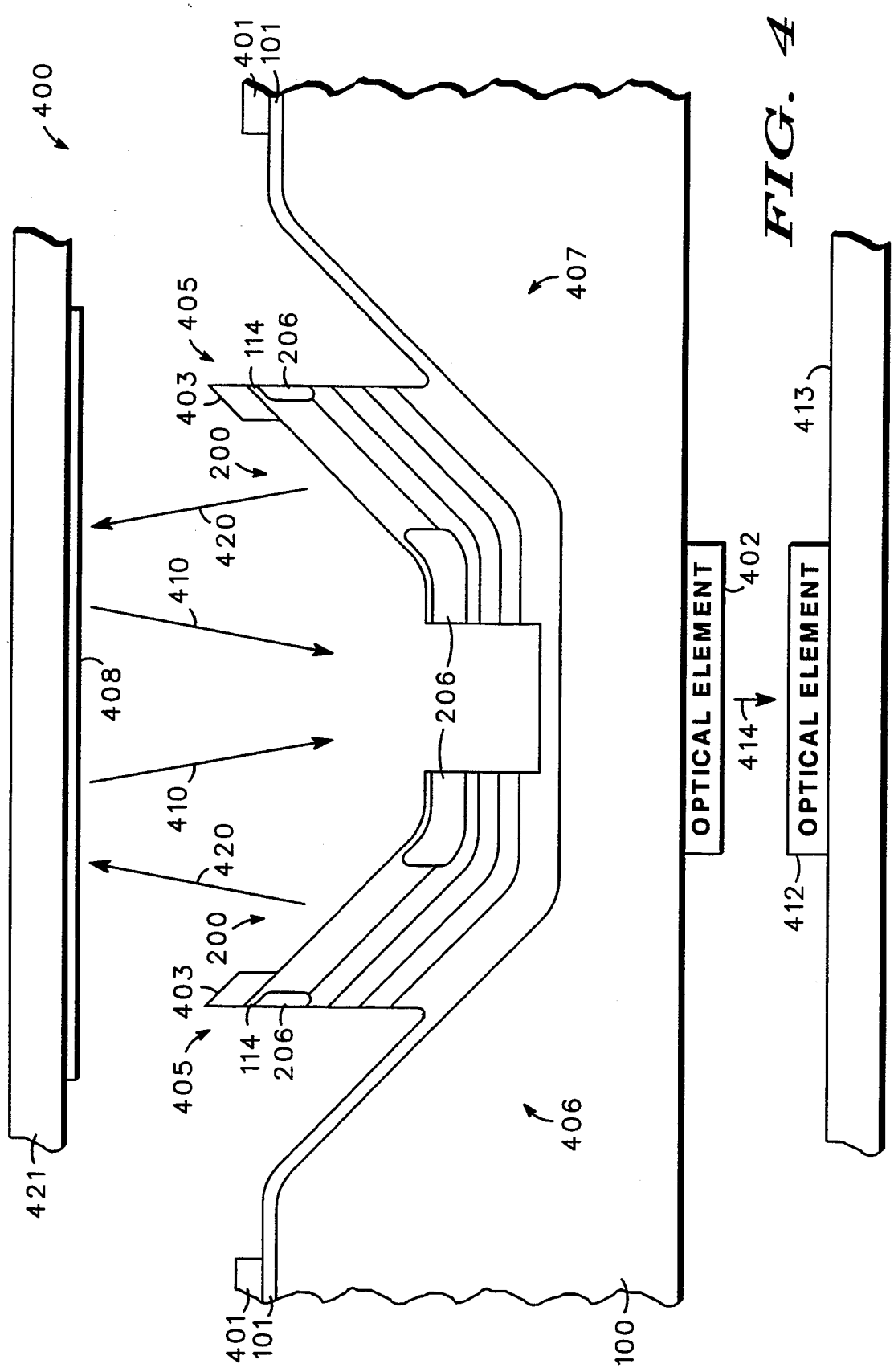
FIG. 4 is an optical reading head in accordance to an embodiment of the present invention.
Figure 5:
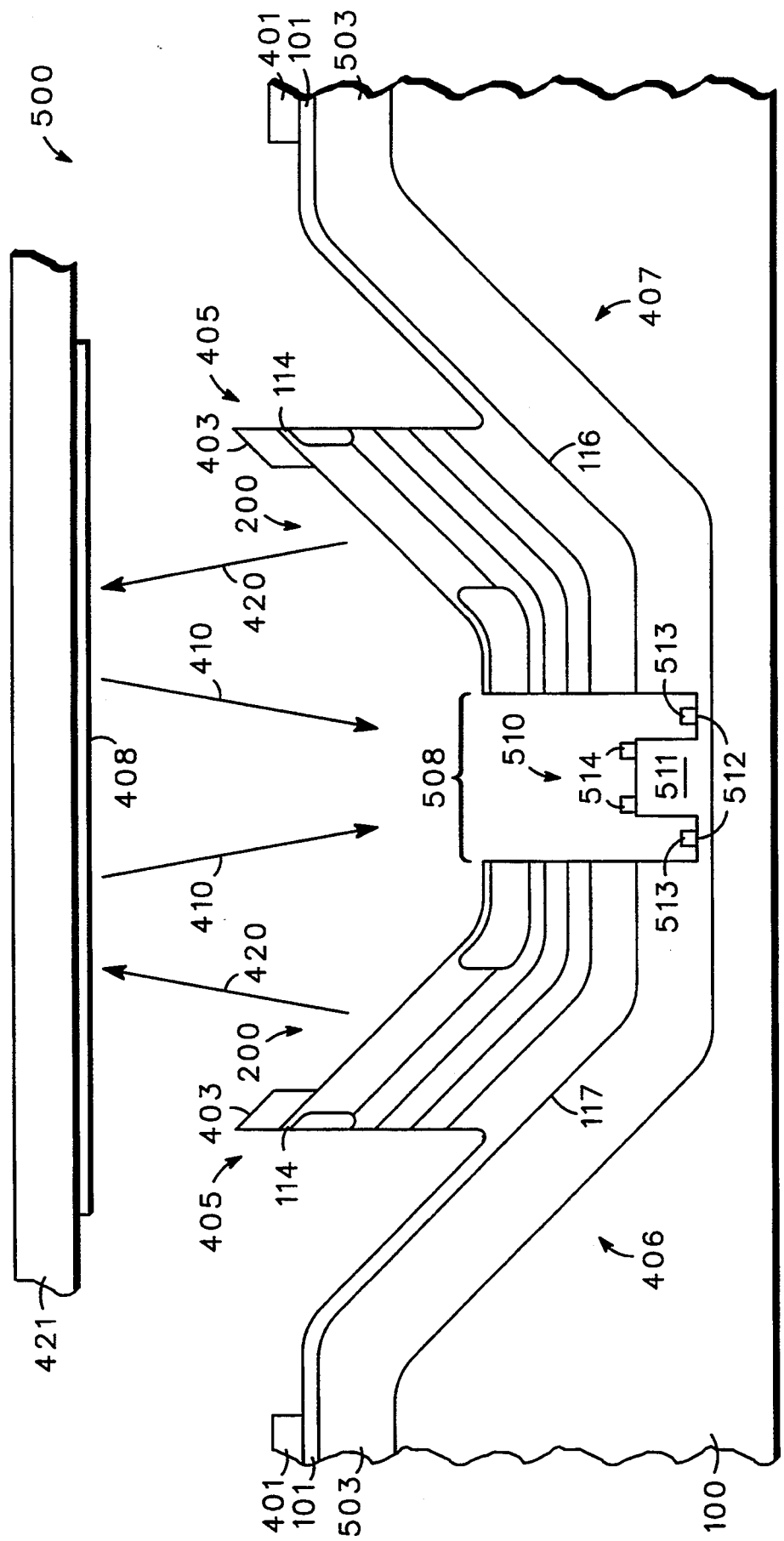
FIG. 5 is an optical reading head in accordance to yet another embodiment of the present invention.

FIG. 1 is a cross-sectional view of an intermediate structure in the manufacture of light emitting devices for optical reading heads 400 and 500 as shown in FIGS. 4 and 5. It should be understood that FIG. 1 is a generalized intermediate step and that many previous processing steps could have been done to substrate 100.

Substrate 100 is capable of being made of several materials, such as gallium arsenide, silicon, or glass. Selection of a substrate material generally is dependent upon a wavelength of emitted light from light emitting devices 406 and 407 as shown in FIG. 4. In a preferred embodiment of the present invention, substrate 100 is made of gallium arsenide. Gallium arsenide is used as substrate 100 to facilitate epitaxial growth of a first mirror region 101. However, prior to processing of first mirror region 101, substrate 100 is processed by well-known methods in the art to produce a groove 102 in substrate 100. Groove 102 in substrate 100 is capable of being fabricated either as a V-groove or as a V-groove with a flat bottom. In a preferred embodiment of the present invention, groove 102 is fabricated as a V-groove with a flat bottom, thus providing facets or surfaces 116, 117, and 118. Groove 102 is capable of being fabricated several by well-known methods in the art, such as photolithographically masking surface 103 of substrate 100 and subsequently etching substrate 100 either by wet chemistries or by dry chemistries. Further, it should be understood that groove 102 is a cross-sectional illustration and that groove 102 extends into the drawing sheet, thus groove 102 is shaped as a long trench-like structure. However, it should be evident that other trench like shapes are capable of being formed, such as curves, angles, and the like that are unseen because the shapes extend into the drawing.

Generally, a multitude or plurality of layers are epitaxially deposited onto substrate 100. The plurality of layers typically are defined as having a lower portion, a middle portion, and an upper portion, wherein the lower portion includes a first mirror region 101, wherein the middle portion includes a first and a second cladding region 111, 113 with an active area or region 112, and wherein the upper portion includes a second mirror region 114.

First mirror region 101 is a group of alternating layers of different compositions that are stacked on top of each other. Epitaxial deposition of the alternating layers of different compositions is accomplished by well-known techniques in the art, such as CBE, MBE, MOCVD, MOMBE, and the like. By using these well-known techniques in the art, a variety of materials, such as gallium arsenide, aluminum gallium arsenide, indium gallium arsenide, aluminum arsenide, silicon or the like are capable of being deposited onto substrate 100. In this specific example, as illustrated in FIG. 1, first mirror region 101 is fabricated of alternating layers of aluminum gallium arsenide and gallium arsenide deposited throughout groove 102 and across substrate 100, thus forming a first stack of distributed Bragg reflectors or mirrors for a Vertical Cavity Surface Emitting Laser (VCSEL) yet to be formed.

Cladding region 111 is epitaxially deposited, as described herein before, on first mirror region 101. Typically, cladding region 111 has two parts that are not shown. First, a layer of a first conductivity type either n-type or p-type is deposited. By way of example, an n-doped layer, such as a silicon doped aluminum gallium arsenide layer, is deposited onto first mirror region 101. Second, an undoped layer, such as an undoped aluminum gallium arsenide layer, is deposited onto the silicon doped aluminum gallium arsenide layer.

Active region 112 is epitaxially deposited, as previously discussed herein before, onto cladding region 111. Active region 112 is commonly made of two barrier regions (not shown) which are deposited on either side of a center quantum well region that is capable of being strained. The center quantum well region produces photons under electrical excitation. Generally, the two barrier regions are each made of an undoped layer, such as undoped gallium aluminum arsenide and the quantum well region is made of an undoped layer, such as undoped gallium arsenide or undoped indium gallium arsenide.

Second cladding region 113 is epitaxially deposited, as previously discussed herein before, on active region 112. Cladding region 113 is commonly made of two parts (not shown). First, an undoped layer, such as an undoped aluminum gallium arsenide layer, is deposited on active region 112. Second, a layer of a second conductivity type either a p-type or n-type is deposited. By way of example, p-type doped layer, such as carbon doped aluminum gallium arsenide, is deposited onto the undoped aluminum gallium arsenide.

Second reflector or mirror region 114 is epitaxially deposited, as previously discussed herein before, on second cladding region 113. The second mirror region 114 also is composed of alternating layers of different compositions, thus making a second stack of distributed Bragg reflectors or mirrors. Generally, the alternating layers of second region 114 are doped to the same conductivity type as cladding layer 113.

Detailed construction of first mirror region 101, first cladding region 111, active area 112, second cladding region 113, and second mirror region 114 is presented in U.S. Pat. No. 5,034,092, entitled "Plasma Etching of Semiconductor Substrates", issued Jul. 23, 1991, assigned to the same assignee and hereby incorporated herein as reference.

Figure 2:
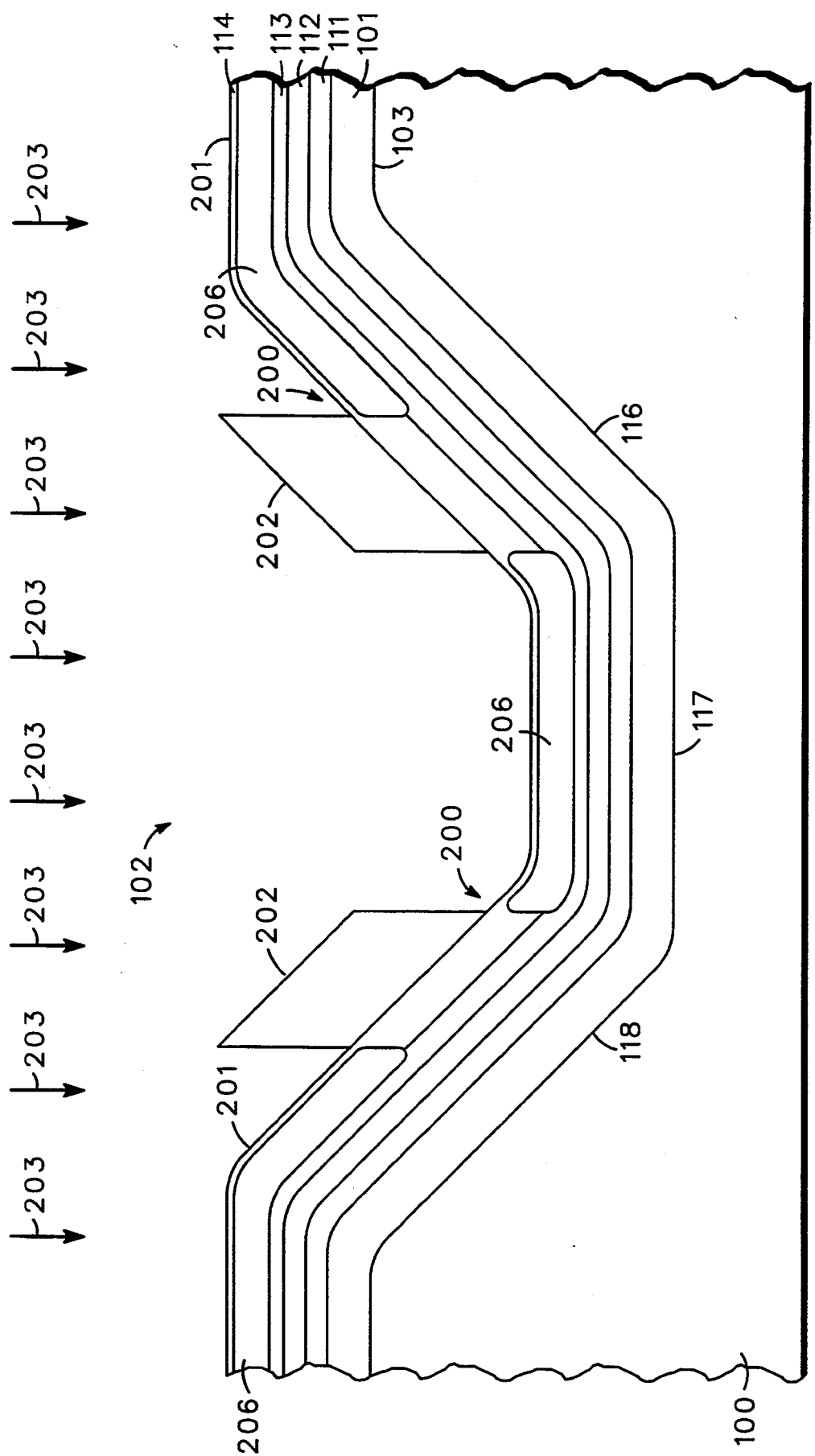
FIG. 2 is an enlarged simplified cross-sectional view of a masked substrate during an intermediate step of defining light emitting devices thereon.

FIG. 2 is another cross-sectional view of an intermediate structure during the manufacture of light emitting devices for optical reading heads 400 and 500 as shown in FIGS. 4 and 5.

After epitaxially depositing second mirror region 114, second mirror region 114 is patterned by well-known methods in the art to define light emitting regions 200. Typically, defining light emitting regions 200 is achieved by well-known photolithography techniques.

Briefly, a layer of photosensitive material such as photoresist (not shown in its entirety) is applied to surface 201 of second mirror region 114. Subsequently, the photosensitive layer is exposed and developed, thereby generating geometric patterns 202 of photosensitive material on surface 201 of second mirror region 114. Additionally, generation of geometric patterns 202 on surface 201 produces areas of surface 201 that are exposed, as well as areas of surface 201 that are unexposed or covered by geometric patterns 202. It should be noted that since photolithographic methods are employed, geometric patterns 202 are capable of being any geometric design, such as circles, squares, ovals, or the like. Further, geometric patterns 202 are made thick enough such that ions, represented by arrows 203, will not penetrate through geometric patterns 202, thus not substantially entering second mirror region 114 under or beneath geometric patterns 202. While FIG. 2 only shows two geometric patterns 202, it should be understood that many more geometric patterns 202 are capable of being formed on surface 201 of second mirror region 114, thus enabling a plurality of geometric patterns 202 to be formed in an array. In a preferred embodiment of the present invention, geometric patterns 202 are circularly shaped and arranged in a linear fashion on surface 201 that corresponds to surfaces 116 and 118 of substrate 100, thus defining an array of light emitting devices.

Once the masking process has been completed, substrate 100 is ion implanted by well-known methods in the art, thereby making impurity region 206 and areas that are not implanted that correspond to light emitting region 200. For example, ions such as Hydrogen (H) or Helium (He), represented by arrows 203, are directed towards surface 201. As previously described hereinbefore, geometric patterns 202 cover portions of surface 201 while other portions of surface 201 are exposed. Directed ions strike and are implanted into both geometric patterns 202 and exposed areas of surface 201, thus resulting in implanted or impurity regions 206. Additionally, ions that are implanted into geometric patterns 202 are blocked by geometric pattern 202, thereby producing a non-implanted region thereunder which corresponds to light emitting regions 200. Additionally, impurity regions 206 are made such that impurity regions surround light emitting region 200.

Impurity regions 206 as shown in FIG. 2 are positioned or located such that the impurity region 206 does not touch active region 112, thus impurity regions 206 do not electrically interfere with active region 112.

Ions, represented by arrows 203, are capable of being selected from a variety of ion sources, such as hydrogen, helium, beryllium, and the like. It should be understood that specific adjustment of an ion implantation system (not shown) is dependent upon at least several factors, such as ion species selected to be ion implanted, depth of the ion implant, and the substrate in which the ions are to be implanted. All of these factors are well known in the art.

Upon completion of implantation processes, geometric patterns 202, are removed by well-known methods in the art, such as an appropriate series of wet processing steps, dry processing steps, or a combination of both wet processing steps and dry processing steps, thus removing geometric patterns 202 and cleaning surface 201.

Figure 3:
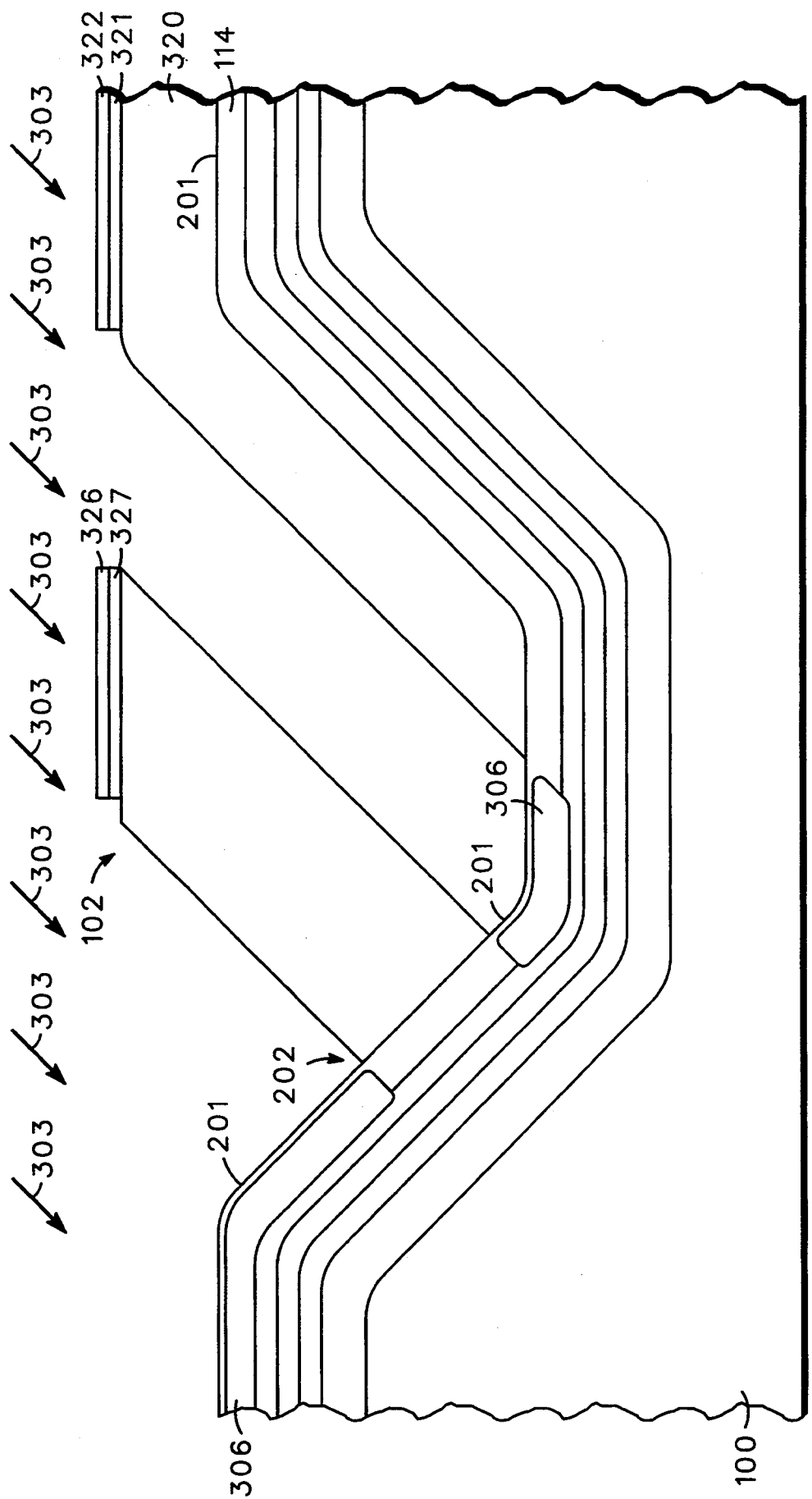
FIG. 3 is an enlarged simplified cross-sectional view of an alternative patterning and masking method for defining light emitting devices.

FIG. 3 is an alternative method for masking and implanting surface 201. Generally, this masking and ion implantation technique is used when critical dimensional control of light emitting region 202 either is desired or necessary. A planarization layer 320 is applied to substrate 100, thus planarizing groove 102. Typically, planarization layer 320 is made from an organic material such as polyimide, a variety of polymers, or the like. An oxide layer 321 is subsequently deposited onto planarization layer 320. Oxide layer 321 generally is deposited by well-known methods in the art such as Plasma Enhanced Chemical Deposition (PECVD), spin-on glass (SOG), or the like. Photosensitive material 322 such as photoresist is then applied to oxide layer 321. Photosensitive material 322 (not shown in its entirety) is then exposed and developed, thereby forming an island 326 on oxide layer 321, as well as exposing portions of oxide layer 321. Subsequently, the exposed portions of oxide layer 321 are etched away by a variety of well-known methods in the art, such as wet etching or dry etching, thereby forming an island 327 and exposing areas of planarization layer 320. The exposed portions of planarization layer 320 are then etched at an angle, thus removing planarization layer 320 and exposing portions of surface 201.

Angle etching of planarization layer 320 is achieved by several known methods in the art, such as Chemically assisted Ion Beam etching (CAIBE), Reactive Ion Beam Etching (RIBE), or Ion Beam Activated Gas Surface Chemistry (IBAGSC). By way of example, using the IBAGSC method to angle etch planarization layer 320, an oxygen plasma from a downstream plasma reactor injects oxygen ions in close proximity to the exposed portions of planarization layer 320 that is tilted to a predetermined angle. Etching or removal of the exposed portions of planarization layer 320 is then accomplished at the predetermined angle, thus exposing a portion of surface 201. Etching is continued until the desired portions of second mirror region 114 are clear and exposed. It should be understood that with second mirror region 114 being made of a material, such as gallium arsenide, aluminum gallium arsenide, or the like, a large selectivity is provided by using oxygen that etches or removes exposed portions of planarization layer 320, thus allowing long periods of etching or overetching without damaging second mirror region 114.

Once the exposed portions of surface 201 are clear and fully exposed, the exposed portions are ion implanted as discussed herein above. However, in order to ion implant into the clear and fully exposed portions of surface 201, substrate 100 is tilted in a manner that allows the exposed portions of surface 201 to be perpendicular to ions, illustrated by arrows 303, thus generating impurity regions 306. Generating impurity regions 306 in the manner described herein above allows impurity region 306 to have sharper profiles, more accurate critical dimensions, and less offsetting of the alternating layers of second mirror region 114, thus resulting in higher performance of light emitting device 406 as shown in FIGS. 4 and 5. Further, it should be understood that while only light emitting device 406 is shown masked, additional processing is capable of being done to provide light emitting device 407 as shown in FIGS. 4 and 5.

Upon completion of ion implantation, masking layer 326, oxide layer 321, and planarization layer 320, are removed by well-known methods in the art, such as a combination of an appropriate series of wet processing steps, dry processing steps, or a combination of both wet processing steps and dry processing steps, thus removing masking layer 326, oxide layer 321, and planarization layer 320 and cleaning surface 201.

Referring now to FIG. 4 and continuing from FIG. 2 after ion implantation, FIG. 4 illustrates a cross-sectional view of optical reading head 400. Additionally, it should be understood that continuing from FIG. 3 is capable of being done just as easily as continuing from FIG. 2; however, for the sake of simplicity continuation from FIG. 2 has been chosen.

After cleaning substrate 100 as previously described herein above is completed, surface 201 of FIG. 2 is patterned by any suitable well-known method in the art that provides an etch mask (not shown) on surface 201, thus masking portions of surface 201 and exposing other portions of surface 201. Etching of the exposed portions of surface 201 with the etch mask is achieved by well-known methods in the art that result in the cross-sectional view illustrated in FIG. 4.

Briefly and by way of example, a photoresist layer (not shown) is applied to surface 201 of FIG. 2 that has been cleaned. The photoresist layer is exposed and developed, thus providing an etch mask (not shown) as well as exposing portions of surface 201. Generally, the etch mask has a similar shape that is slightly larger than light emitting area 200, thus after etching of exposed portions of surface 201 impurity region 206 surrounds and isolates light emitting region 200. Generally, etching of exposed portions of surface 201 is achieved either by wet etching or dry etching, such as an aqueous solution of Sodium Hydroxide or a chlorine containing gaseous plasma, respectfully. The etching of the exposed portions of surface 201 is continued until at least active region 112 is removed. It should be noted that after the removal of active region 112 the etch is capable of being stopped anywhere in the first mirror region 101. Generally, structure 405 is formed into a mesa, thus having a three dimensional quality that is not readily appreciated in the cross-sectional view illustrated in FIG. 4.

Providing an n-contact 401 and a p-contact 403 to light emitting devices 406 and 407 are capable of being achieved by any suitable method well known in the art. It is not the intent or the purpose of the present application to discuss all the well-known methods for providing contacts 401 and 403, nor is it necessary for an understanding of the present invention to discuss each of these well-known methods in the art. However, a brief description for making contacts 401 and 403 is included so as to orientate the reader.

By way of example, n-contact 401 and p-contact 403 are made either separately or together. Generally, n-contact 401 and p-contact 403 are made by depositing a conductive material, such as a metal, a metal alloy, a conductive silicon, or the like onto first mirror region 101 and onto second mirror region 114. The deposited conductive material is then patterned appropriately to provide electrical leads (not shown) to n-contact 401 and p-contact 403.

N-contact 401 and p-contact 403 allows for a threshold current to be applied to light emitting devices 406 and 407, thus exciting the active area in light emitting devices 406 and 407 so as to produce light or photos. The light or photons are reflected by first and second mirror regions 101 and 114 in light emitting regions 200, thus generating a lasing of the light. While the description herein above generally defines a VCSEL, it should be evident that other light emitting devices could be formed as well, such as light emitting diodes (LEDs), and the like.

A portion of the light produced in light emitting devices 406 and 407 is released, illustrated by arrows 420, from second mirror region 114 and moves away from light emitting devices 406 and 407 and toward image or document 408 that is supported by structure 421. Light emanating from light emitting devices 406 and 407 strikes image or document 408 and is reflected, as illustrated by arrows 410, back towards substrate 100. The reflected light passes through first mirror region 101 and substrate 100 to optical element 402, as long as wave length of emitted light is transparent to substrate 100 made of gallium arsenide. Active region 112 made with an indium gallium arsenide quantum well emits light that is capable of passing through substrate 100 made of gallium arsenide.

Optical element 402 located on substrate 100 is capable of being a variety of different optical elements, such as a photo detection device, a lens, a lens system, a diffraction grating, or the like. With optical element 402 being a photo detection device, the photo detection device is capable of being any suitable photo detection device that is well known in the art, such as a PIN photo detector, a photo diode, or the like so as to capture the reflected light from image or document 408. Additionally, the photo detection device is capable of being fabricated using substrate 100 as a starting material in conjunction with well-known process in the art to fabricate the photo detection device. Further, the photo detection device is capable of being previously manufactured and applied to substrate 100.

With optical element 402 being a lens, or lens system, the lens is capable of being any suitable lens, such as a convex lens, a concave lens, Fresnel lens, or any combination of the above. Further, the lens is capable of being fabricated using substrate 100 in conjunction with well-known processes in the art to make the lens or lens system, as well as have the lens or lens system previously manufactured and subsequently applying the lens or the lens system to substrate 100.

An optical element 412 located on a support structure 413 is capable of being a variety of optical elements, such as a photo detection device, a lens, a diffraction grating, or the like. Structure 413 provides supports to optical element 412 and allows positioning of optical element 412 in relation to light, illustrated by arrow 414.

With optical element 412 being a photo detector, light (414) has been previously processed either by passing through optical element 402 or by passing through substrate 100. Typically, processing of light is achieved with optical element 402 being a lens that collimates the reflected light and focuses that light onto the photo detector to capture the light.

In the present invention, emitting devices 406 and 407 are integrated into substrate 100, thereby simplifying and reducing the number of steps required in conventional manufacturing. Further, integration of light emitting devices 406 and 407 with substrate 100 reduces the number of assembly steps, thus a higher degree of quality with a reduction of cost is achieved. Moreover, use of substrate 100 having light emitting devices 406 and 407 integrated therein, and further integrating the assembly of optical element 402 into optical reading head 400 further simplifies the manufacture of optical reading head 400, thus reduction of cost is realized, as well as an increase in quality of optical reading head 400.

FIG. 5 is yet another embodiment of the present invention, wherein the photo detection device is directly incorporated into optical reading head 500.

Substrate 100 is prepared in a similar fashion as previously described in FIG. 1. However, prior to the deposition of first mirror region 101, a deposition of several epitaxial layers 503 are deposited so as to produce a photo detection device 510. Once epitaxial layers 503 have been deposited, similar processes are carried out as described in FIGS. 1–3. However, prior to the deposition of n-metal layer 401 and p-metal layer 403, first mirror region 101 is patterned and etched by well-known methods in the art such that light receiving opening is continued to form light receiving opening 508, thereby exposing a portion of epitaxial layers 503 through light receiving opening 508. Once epitaxial layers 503 are exposed, substrate 100 is cleaned by well-known methods in the art. The cleaned substrate is again patterned and etched to make a mesa structure 511 and exposing surfaces 512. Contacts 513 and 514 are provided to photo detector 510 in the same manner as previously discussed hereinbefore, thus enabling reflected light, as shown by arrows 410, to be reflected onto photo detector 510, thus integrating photo detection device 510 into substrate 100 and unifying fabrication processes of optical reading head 500.

Moreover, it should be understood that photo detector 510 is capable of being fabricated, as described hereinabove, under surfaces 116 or 117, thus allowing photo detector 510 to be positioned at an angle.

By now it should be clear that the optical reading head provided by this invention combines the advantages of fewer steps and fewer parts during its fabrication and overall assembly. Moreover, a method has been provided to place light emitting devices on angled surfaces which enhances quality, simplifies processes, as well as lowering cost by reducing the number of steps and reducing the number of individual components for the optical reading head.

We claim:

1. An optical reading head comprising:
   a plurality of light emitting devices comprising an array formed on an optically transparent substrate, the substrate having a first surface and a second surface, wherein the first surface and the second surface are joined, and wherein the first surface of the optically transparent substrate defines a normal plane and the second surface of the optically transparent substrate defines another plane set at an angle at which the plurality of light emitting devices are positioned, thereby positioning the plurality of light emitting devices for emitting of light toward an image that reflects a portion of the emitted light back towards the optically transparent substrate; and
   a detecting device located in a plane normal to the angled light emitting array that captures light reflected from the image toward the optically transparent substrate, thereby sensing the reflected light.

2. An optical reading head as claimed in claim 1 wherein the detecting device is a photo diode.

3. An optical reading head as claimed in claim 1 wherein the angled light emitting array is a VCSEL array.

4. An optical reading head as claimed in claim 1 wherein the substrate is gallium arsenide.

5. An optical reading head as claimed in claim 1 wherein the angled light emitting array is an LED array.

6. An optical reading head as claimed in claim 1 wherein the second surface of the optically transparent substrate further includes an optical element located between the detecting device and the angled light emitting array.

7. An optical reading head as claimed in claim 6 wherein the optical element is a lens that collimates the reflected light.

* * * * *